United States Patent [19]
Woolbright

[11] Patent Number: 5,640,497
[45] Date of Patent: Jun. 17, 1997

[54] LAYOUT REDESIGN USING POLYGON MANIPULATION

[76] Inventor: Phillip Alexander Woolbright, 1900-D McCulloch Blvd., #206, Lake Havasu City, Ariz. 86403

[21] Appl. No.: 377,008

[22] Filed: Jan. 23, 1995

[51] Int. Cl.$^6$ .................................................. G06T 11/00
[52] U.S. Cl. ........................... 395/133; 395/135; 395/921; 395/964
[58] Field of Search .................................. 395/133–135, 395/139, 141, 155, 161, 919–921; 364/488–491

[56] References Cited

U.S. PATENT DOCUMENTS

| | | | |
|---|---|---|---|
| 4,829,446 | 5/1989 | Draney | 395/133 X |
| 5,164,911 | 11/1992 | Juran et al. | 395/100 X |
| 5,533,148 | 7/1996 | Sayah et al. | 364/491 X |

*Primary Examiner*—Almis R. Jankus
*Attorney, Agent, or Firm*—Aquilino & Welsh

[57] ABSTRACT

A method and system for redesigning layouts adjusts polygon data to develop a new layout which meets new design rules. Polygon data defining the original layout is further broken down into equated layers which are logical combinations of the layers in the original layout. The further broken down data is typically in the form of rectangles, and associated information regarding how that particular rectangle was formed by logical combinations of layers. This further broken down information is then moved to conform to the new design rules, and the moves are checked against a technology file to ensure that the particular movement can be made.

22 Claims, 8 Drawing Sheets

(a) LAYER A BOOLEAN LAYER A

(b) LAYER A BOOLEAN LAYER B

(c) LAYER A BOOLEAN LAYERS C,D,E,...

LAYOUT REDESIGN USING POLYGON MANIPULATION

COPYRIGHT NOTIFICATION

Portions of this patent application contain materials that are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention generally relates to improvements in redesigning layouts, and more particularly to a system and method for redesigning layouts using polygon manipulation and new design rules.

BACKGROUND ART

The process of RE-layout design has caused companies to spend small fortunes in limited human resources. The turn around time for a RE-layout is equal to several man years.

FIG. 1 shows a typical redesign process for a chip layout for new design rules. The prior art redesign process takes the chip layout 10 and breaks down the layers into symbols representing elements such as transistors 12. The original chip layout is used to draw a symbolic form which is hierarchical. Based on the new design rules the symbols are moved to optimize chip layout according to the new design rules 14. The process of drawing the original chip layout in symbolic form 12, laying out a new symbolic form 14, and creating a new chip layout 16 is extremely labor intensive.

What is needed is a way to reduce the labor-intensive conversion of chip layout to symbolic form, creating a new symbolic representation based on the new design rules, and converting the new symbolic representation to a chip layout for fabrication.

SUMMARY OF THE INVENTION

Accordingly, it is a primary object of the present invention to provide a system and method for redesigning layouts.

It is a further object of the present invention to provide a system and method for redesigning layouts having hierarchical characteristics.

It is another object of the present invention to provide a system and method for redesigning layouts by developing polygon information directly from the original layout, and manipulating the polygon information.

It is still another object of the present invention to provide a system and method for redesigning layouts by developing polygon information which incorporates design rule limits which define what characteristics the polygon information has with respect to the location and type of polygon.

These and other objects of the invention are achieved by redesigning layouts using polygon data. The polygon data is capable of being broken down into polygon segments, and subsegments of the polygon segments if necessary.

In a preferred embodiment of the present invention original polygon data is derived from a layout. The original polygon data defines layers of the layout, and the polygons which make up each layer. This data may be manipulated such as by rescaling, or it may be left alone. In either case, the data is further analyzed to develop information regarding the polygons which are created by the interaction between layers of the layout. The combinations of layers are defined by Boolean relationships between the layers. The present apparatus and method culls through the original data, either manipulated or unmanipulated, to discover exactly which polygons are formed by the interaction between the layers of the layouts. For each Boolean layer equation, then, there will be a set of polygons discovered which are formed by that Boolean layer equation. This process creates new layers, called equated layers, which are defined as interactions between layers, and the polygons which make up that layer. This new set of definitions of equated layers and polygons is called created data herein.

The creation of the new layer data is based on the new design rules to which the new layout must conform, and basic principles of layout design requirements. That is, not every relationship between the layers need be defined by equated layer information. The design rules define what is important, and the layer interactions which these design rule limitations deal with are the layer interactions which are discovered, and made part of the newly created equated file. Basic principles of layout design may also dictate that particular layer interactions must be kept within certain parameters, and polygons meeting these criteria are also made part of the newly created equated file.

Each of these files may be further broken down to dimensions consistent with the dimensions required by the new design rules. This is carried out by breaking down some or all of the segments of the polygons in the original data and the created data into subsegments. The resulting segments (if any) and subsegments (if any) of the original and created data are then moved, each move being checked against a file which defines constraints for types of segments and subsegments of the original and created data.

The present apparatus and method provide for movement of polygon data to meet particular new design rule criteria. By defining the data by not only polygons of layers, but also by polygons created by combinations of layers, the design rules are able to impact the redesign at a finer level of detail than possible with prior art methods.

DESCRIPTION OF THE PREFERRED EMBODIMENT

A detailed embodiment of the present invention is disclosed herein. It should be understood, however, that the disclosed embodiment is merely exemplary of the invention, which may be embodied in various forms. Therefore, the details disclosed herein are not to be interpreted as limiting, but merely as the basis for teaching one skilled in the art how to make and/or use the invention.

While the below discussion is often in terms of chip redesign, and therefore may use terms of chip levels/layers, it is contemplated that the present invention could be used with respect to any system which is attempting to redesign layouts having hierarchical levels. For example, the present system could be used, but not limited to, integrated circuit redesign, printed circuit board layout redesign, home layouts, etc.

The present apparatus and method invokes artificial intelligence into a layout to RE-design itself virtually changing the way industry conducts a RE-design of a physical layout product. The turnaround time and human effort are a small fraction of the old method and apparatus.

Many multi-layer systems are built in hierarchical form and conform to, or come close to conforming to, the hierarchy of the schematics or specifications for that design. Levels of the hierarchy may include, using chips as an example, full chip level, functional block level, section level, cell level, gate level, transistor level, symbolic level and polygon level. All of these levels can be placed in a computer data base in a set of nested files. These levels of hierarchy are reflected (usually) in the schematics or specifications.

The present system and method operates on flattened or PG data. Flattened data is data which has eliminated the hierarchy of the design. The hierarchy is replaced later after the redesign of the data has taken place. The layout to be redesigned should be logic verification system (LVS) correct and design rule correct (DRC) using any of the following off-the-shelf products: Cadence Dracula software, Integrated Silicon Systems Vericheck or other similar software products.

Overall Process Flow/Original Data

Figure 1:
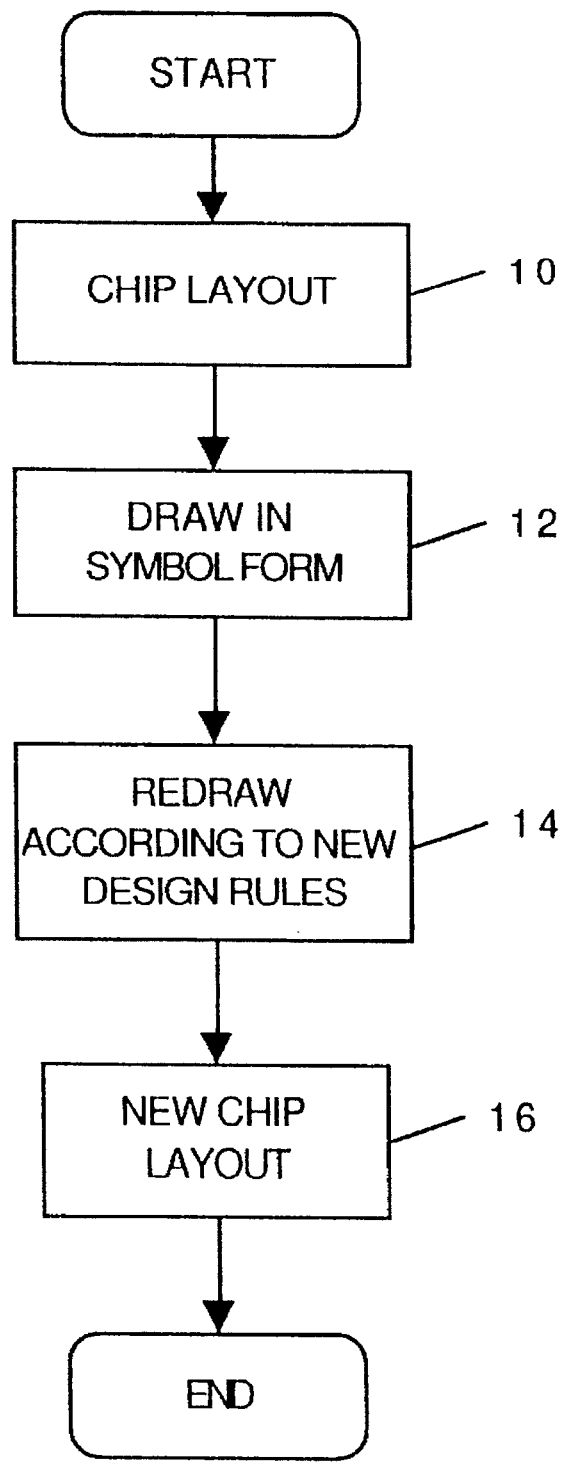
FIG. 1 is a flow chart showing the redesign process of the prior art.
Figure 2:
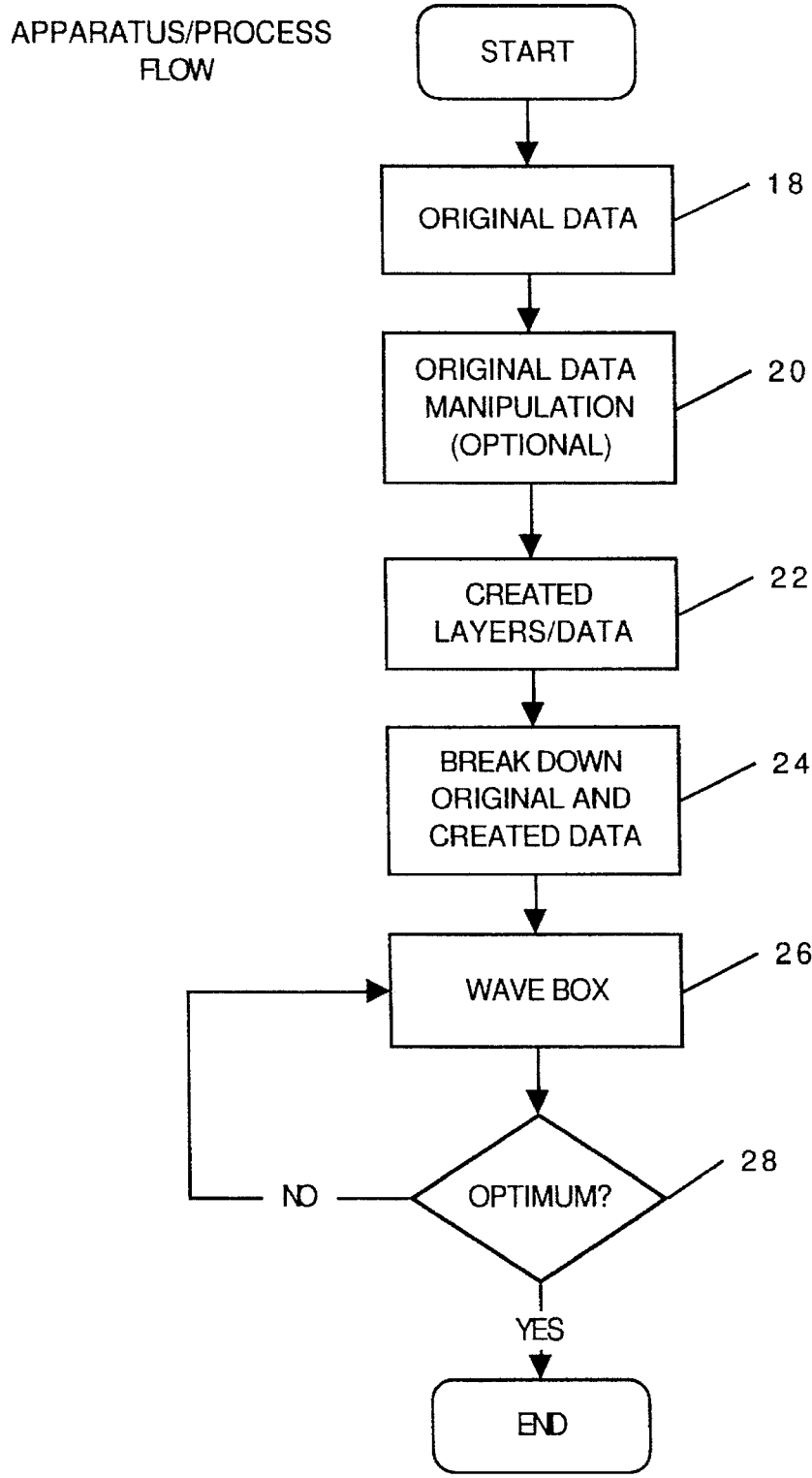
FIG. 2 is a flow chart depicting the overall process flow of the redesign apparatus and method as disclosed herein.

FIG. 2 shows the overall process flow of the present apparatus and method. Original data is developed from the layout to be redesigned 18, and may optionally be manipulated 20, such as by rescaling according to certain parameters of the new design rules. The manipulation step 20 is optional, as shown in the FIG. 2, and is not required to be performed. The manipulation step is merely representative of one of many operations which could be performed on the original data. As used herein, the term "original data" means both the data which is developed from the original layout, or the manipulated data, whichever is used in the particular process. The original data is then used to create new layers, or data 22. Once the original and created data is prepared, each of these types of data are broken down further into segments and subsegments 24. The broken down original data and broken down created data is then hit with a wave box 26 until the design is optimum 28. The details of these steps will be discussed in further detail below.

As part of the typical process of chip fabrication, a chip layout is turned into a representation called PG data. The PG data is basically a representation of the chip layout in polygons, such as squares or rectangles. A tape having PG data thereon is then used as input to an e-beam machine for fabricating chips by flashing rectangles to create a reticle. PG data is a specific form of "flattened data," or data that is non-hierarchical.

As previously stated, "original data" means polygon data which is developed from the original layout which is to be redesigned and used in the next step, either in manipulated or unmanipulated form. The original data defines names of layers, and the polygons which make up each particular layer.

Figures 3, 4:
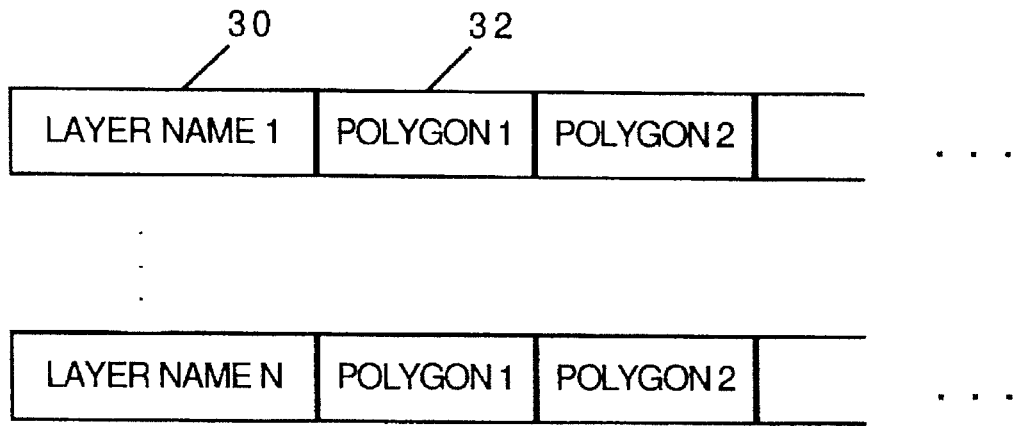
FIG. 3 shows what could be used as a data structure to define the original data.
FIG. 4 is a block diagram depicting a possible data structure for use in defining layer equations when developing the created data.

FIG. 3 shows what could be used as a data structure to define the original data. The present apparatus and method is capable of using such flattened data to redesign a layout. During development of the initial flattened data based on the layout to be redesigned, the levels, or layers, of the layout are given names, as shown at 30. Typical levels, using chip fabrication as an example, may include a diffusion layer, polysilicon layer, contact layer and metal layer. Each layer is made up of polygons, which are also defined by coordinate information, as show at 32 and labelled Polygon1. The original data is typically made up of several layers and the associated polygons at each layer.

It should be noted that the prior art redesign process, as discussed above, takes the original chip layout and develops human interface to create a symbolic representation for redesign. The symbolic representation is created by drawing a symbolic representation from the original layout, moving the symbols according to the new design rules to create a new symbolic representation, and developing a new chip layout from the new symbolic representation. PG data, or similar data, is not used during this process.

In contrast, the present apparatus and method uses PG data, or other flattened data similar to PG data. Such data is used in the usual process of fabricating a chip from a chip layout. The present apparatus and method uses this flattened data, or other PG-like data, to develop further flattened data which is partially defined by logical combinations of layers, as will be discussed in detail below.

Creating Equated Layers

The present apparatus and method takes the original data consisting of named layers and the polygons which make up the named layers, and breaks down every layer even further into what will be called "equated layers." As discussed above, before the equated layers are created, however, the original data could be rescaled based on the new design rules which define the redesign of the layout. The rescaling may be performed in a variety of ways. One way is rescale the original data according to the largest percentage change between the old design rules and the new design rules. The polygon movement would then move data which did not require this large of a percentage of change. "Equated layers" this will sometimes be referred to below as "created data," or "created layers."

It should be noted that the original data could be polygon data of any type. Rectangular polygon data is easy to use, but is not required.

FIG. 4 shows possible formats of equations which could define equated layers. As shown in (a), the equation could define a relationship between a layer and itself, as shown in (b), between a layer and another layer, and as shown in (c), between a layer and several other layers. The layer equations basically define possible relations between the layers of the original data. The logical operators used in defining the layer combinations include operators such as OR, NOT, XOR, etc. The equations may be defined by human, or could be culled from the original data by computer.

Figure 5:
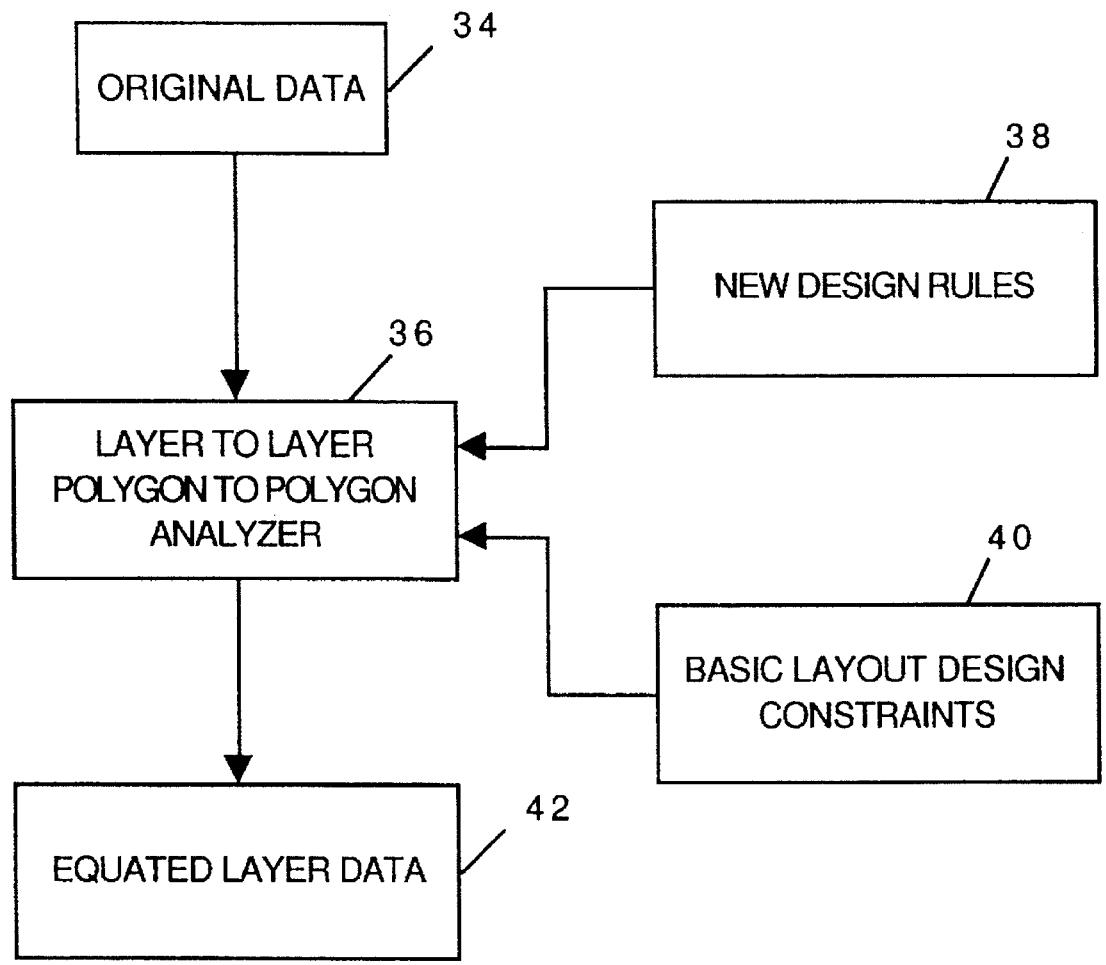
FIG. 5 is a functional block diagram showing elements and information flow necessary to create equated data.

FIG. 5 is a block diagram showing the elements and flow of information necessary to develop created data. The fundamental goal is to develop new layers of information based on the layer equations which are meaningful to the new design rules, and basic principles of design. The original data 34 is input into an analyzer 36 which takes the original data level by level, and analyzes each polygon of that level to see how the polygon of the level is created. Any shelf DRC and LVS software program is capable of carrying out this function. The polygon of a particular level can be defined by the several polygons characterized in terms of the layer equations discussed above. The particular polygons of concern in the redesign process will be those defined by the new design rules 38, and the basic principles of layout constraints 40. From this analysis, equated layer data 42 is created.

Figure 6:
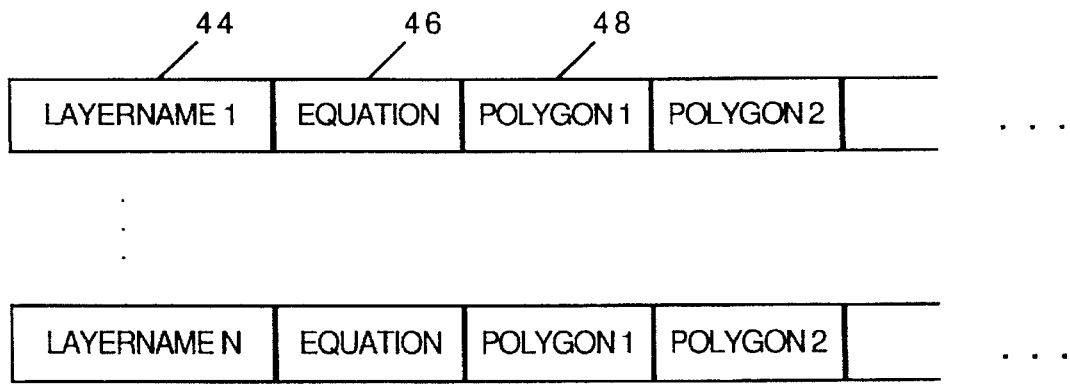
FIG. 6 is a possible representation of a data structure for equated data.

FIG. 6 shows a possible format of the newly created layer data, defined in terms of Boolean equations of layers. The new layer may arbitrarily given a Layername 44, and is defined by a Boolean equation of layers, as shown in FIG. 4, followed by the polygons which make up that particular layer. There may be as few as one polygon for a particular equated layer, but FIG. 6 shows that multiple polygons for a particular equated layer may be accommodated.

The newly created equated layers are a second type of flattened data having associated equations of combinations of named layers. That is, the newly created equated layers are defined by a certain layer combination and the polygons which make up the equated layer. The breaking down of named layers even further is carried out by a PG compiler, and breaks the data down into PG data polygons. This PG polygon data, in the form of rectangles, allows program manipulation.

The polygons of the created data may reflect both inter- and intra-layer qualifies.

Put another way, the equated layers capture information regarding what matters and what does not matter with respect to the new design rules, the logic vefication rules, and the known specifications which are purposeful for the design. For example, when entities in a layer cross entities of other layers, there are certain parameters about these crossings which must be maintained in the chip redesign process. These parameters are characterized by the new design rule constraints. These parameters which must be maintained are captured in and defined by the equated layer information. The crossings of interest for purposes of creating new equated layers include any cross between any shapes, including shapes that encompass others. For example, in chip layouts, P-channel diffusion is always encompassed by N-tub, and this crossing characteristic must be incorporated into the equated layer information so the proper relationship is maintained in the final redesign. Later, when the redesign is carried out by moving the polygon data which defines the chip layout with new design rules, the equated layer information places constraints on the movement of the polygon data because polygons found in a particular combination of levels must maintain certain criteria defined by the design rules.

A named or original data layer list, again using the chip redesign process, may be as follows: n diffusion layer, p diffusion layer, well, tub, contact p, contact n, contact poly, via poly, metal1, metal2. An equated, or created, layer list may be as follows: transistor layer, gate overlap layer, drain layer, source layer, metal around contact layer, metal around via layers, inverse of all layers, Vdd layer, Vss layer, various analog device layers, extent/border layer, inside tub layer, etc.

The equated layer data is in the form of polygons, typically tiny rectangular forms which may be smaller than the elements which are normally considered to comprise the chip (e.g., transistors). This information is in a form similar to PG data. That is, the data is in the form of rectangles and information about those rectangles.

Figure 7:
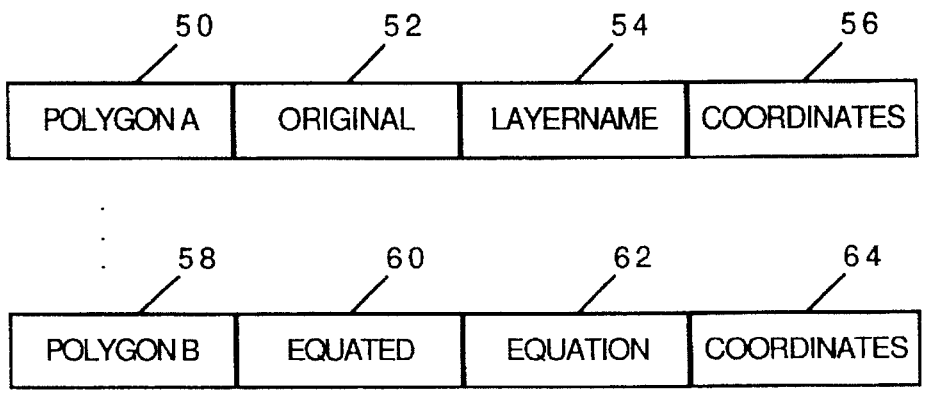
FIG. 7 is a possible alternative representation of a data structure for representing original and equated data.

FIG. 7 shows an alternative representation of original and created data. For original data, a Polygon A 50 is defined as type Original 52 which is on Layername 54, and has Coordinates 56. For equated data, Polygon B 58 is of type Equated 60, which is on the layer defined by Boolean Equation 62, and has Coordinates 64.

While the above information has been described in terms of polygon information, it is contemplated many other forms could be used without departing from the spirit and scope of the invention. For example, the information could be broken down into squares, pentagonal, or even circular shapes. Each of these could be defined in terms of equated layer information.

Breakdown of Original and Created Data

The segments making up the polygons in the original and created data could be used directly to form the new design by moving the segments as described below, or, alternatively be broken down into segments and subsegments, even broken down entirely into subsegments for movement to create the new design.

Figure 8:
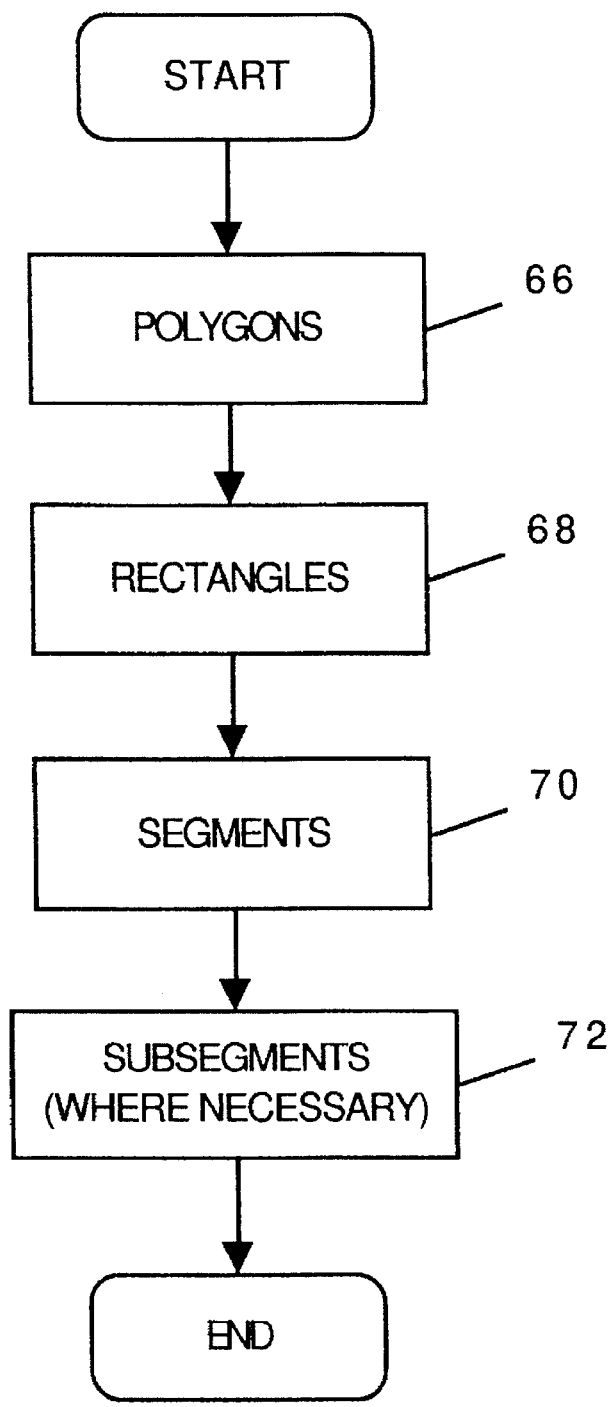
FIG. 8 is a flowchart which demonstrates breaking down original data and created data in preparation of polygon data movement to conform to new design rules.

Once the created data has been developed from the original data, the created data and original data is broken down to a level dictated by the new design rules. FIG. 8 shows a possible breakdown. First, the polygons 66 are broken down into rectangles 68, which are broken down into segments 70, which are broken down into subsegments 72, if necessary. Step 72 may result in no subsegments being formed, leaving all segments; or may result in some subsegments being formed, leaving a mixture of subsegments and segments; or, finally, may result in all segments being translated to subsegments, leaving no segments and all subsegments. As indicated on the drawing the breaking down of segments to subsegments only occurs where the new design rules suggest that this should be performed.

In other words, each segment, defined by a coordinate pair is now broken down even further to create subsegments, defined by sub coordinate pairs. The subsegments are pieces of the original segments, on the original square or rectangle, from the data making up a polygon on a given layer or equated layer. The subsegments are calculated to be no shorter than the "width design rule" of that given layer or equated layer. All odd lengths would be rounded up to be greater than the minimum width design rule for that given layer or equated layer.

For example, say Vdd and Vss metal subsegments would be created at 2 and 3 units long to compensate for segments that are 5 units long. In this case there is obviously no way to split the segment by the design rule width of 2. If the subsegment was made by cutting the segment by only 2 units, then the subsegment would create a design rule violation. (2+2+1) 1<2.

Another example: Regular metal subsegments, defined by sub coordinate pairs, would be created at 0.8 units long. If the segment was 8 units long then the subsegments would total 10 subsegments with length of 0.8 units each. On the other hand if the segment was 8.1 units long then one of the subsegments would need to be 0.9 units longs to compensate for the unequalled in distance of the original coordinate pair. This procedure of creating subsegments would be accomplished for each segment on each original data layer and each created data layer, for every segment.

Movement of Segments and Subsegments

At this point there are high numbers of subsegments created. Each one of these subsegments, as well as the segments which have not been broken down, can move. They move one at a time. The movements are based on a number of different limiters assigned in the movement formula from a "technology file" (TF), discussed in greater detail below. All of the sub coordinate pair segments are assigned a formula listed above according to the new TF for the new process.

One example of a limiting movement factor is the sub coordinate pair segment orientation vertical—moves left to right, horiz—moves up and down. 45s move angular on a 45 degree angle.

Another example would be that the subsegments move when it finds a design rule violation area defined by a Design Rule Checking program. The program finds an error by combing and searching the layout in a defined manner (top to bot, bot to top, left to right, right to left or from the center outward in some cases). The program then fixes the error by moving the sub coordinate pair segments away from the error in the defined "wave direction".

The basic process of segment and subsegment movement involves attempting to move the segments and subsegments to meet the new design rules using a wave box or other method of moving segments and subsegments, and checking the attempted moves against predefined limitations of movement for the particular segment or subsegment type. Another type of segment/subsegment movement method could use, for example, a compaction algorithm. The predefined limitations of movement are defined by a "technology file" (TF).

Figure 9:
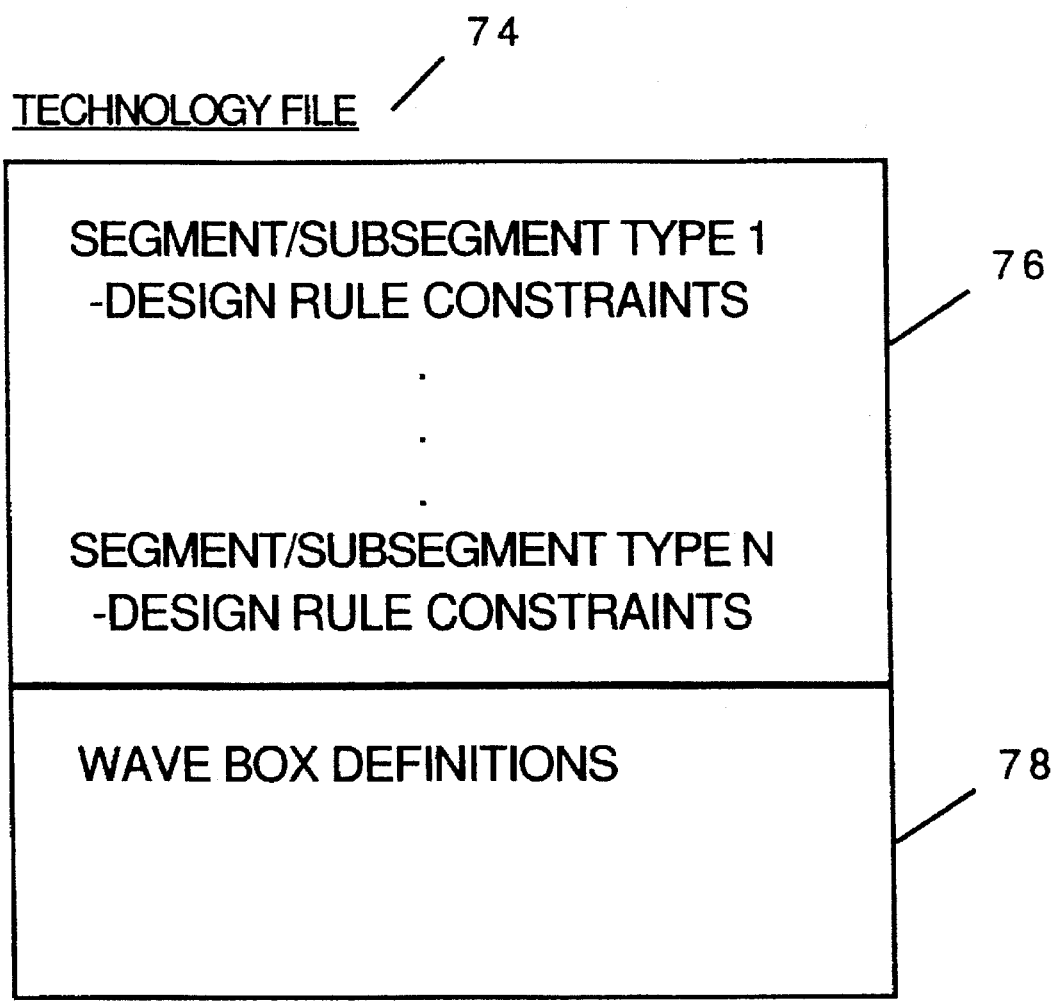
FIG. 9 is an example of a format for a technology file.

FIG. 9 shows a possible TF at 74. The TF contains information regarding design rule constraints for particular segments and subsegments 76, as well as wave box definitions 78. The wave box definitions 78 may be, for example, directions the wave box is to travel, or how many waves to attempt.

A TF is created by a human inputting segment types, subsegment types and limiters associated with these types. The TF defines limiters, or movement parameters. These movement parameters, or limits, are predefined known limits based on the particular relationships which must be maintained among the segments and subsegment types in order for the redesign to maintain proper performance and function. The TF is made based on the new design rules, and defines what is possible with respect to movements of particular types of segments and subsegments.

For example, the TF will have parameters defining how close one layer can be with respect to another layer. The TF defines what movements are acceptable for the smallest subsegments, and what conditions must be maintained for those subsegments to be moved. A form of the information which the TF may have could be "For Subsegment of Type 1, Movement X may occur as long as Condition(s) Y is/are maintained." Movements then proceed according to what is defined as possible by the TF.

The TF could be considered to be a form of artificial intelligence because the function it performs, checking polygon data movement against predefined constraints, is normally associated with human intelligence. The TF file may be implemented in any manner which is capable of performing the checking of polygon data movement. For example, the TF could be in the form of a table which is referred to by a method or apparatus when the method or apparatus is testing the propriety of a particular proposed movement of polygon data.

There may be many different types of segments and subsegments. The TF may define limiters for segments or subsegments of contact, of metal, or of poly contact, according to the respective limiters for each type of subsegment.

CONSIDERATIONS/EXAMPLES

By way of example, say that the original data was rescaled by the largest difference of change in the design rules. The percentage of shrink that is performed equals the largest difference of change from old design rules to the new design rules.

For example, say there are ten design rules having a spacing of 1 unit, and a width of 1 unit. The new design rules define all spacing of 0.8 units and width of 0.8 units. The difference is 0.2 units (the largest difference of change in the new rules). The percent shrink for the original data is 20% (the largest percentage difference of change in the new rules).

Note that gate sizes are in accordance with w/l (width over length) information from the LVS runs on the drawings. This data is taken into account as well and plugged into the scaled down transistors. The new schematics with the new w/l info are then plugged into those transistor areas to be adjusted to the new w/l data later in the program.

Now, assume that one of the spacing rules has changed to 0.9 units and one of the width rules has changed to 0.9 units. Also, the shrink to 0.8 rule is incorrect for this particular case and needs to be changed. Those objects in the original data that have been shrunk to 0.8 width need to be changed to conform to the new 0.9 rule. Note that if only one rule would have changed to 0.7 units then the whole layout would have been shrunk by a factor of 30% because this would have been the largest difference of change in the rules.

Fixing only one rule may require movement of many polygons because:

1. the movement of the 0.9 unit polygons will affect other polygons;
2. the gate sizes must be adjusted to the new z/l via our new schematics (shrinking the gates may not help the process at all because they may need to be adjusted drastically, effecting the framework of the entire drawing); and
3. the apparatus and method may look at the design overall and shrink the design as much as possible after the initial fix of the new rules has been performed.

The redesign process performed by the present apparatus and method involves movement of the polygon data according to the new design rules, while staying within the limits defined by the limiters associated with the rectangles. For example, a 2 micron×1 micron shape is being conformed to a new design rule having 1 micron for a particular shape. The 2 micron segment is broken down into two 1 micron segments. Movement of one of 1 micron subsegments is first attempted. If this subsegment is moved, the other subsegment is moved. In general, if a segment or subsegment can be moved, it can be made smaller.

The general goal is to see how many subsegments can be made out of a particular rectangle. In the above example, because two sides have been made into four subsegments, there are a total of four subsegments and two segments defining the rectangle. It should also be noted that the four subsegments are still also considered to be two segments.

Subsegments should be no smaller than the smallest design rule. If a subsegment is smaller than the smallest design rule, which is referred to as fractionating, the subsegment must be fixed to conform to the smallest design rule. Design Rule Checking (DRC) will discover such discrepancies between the design rules and the subsegments.

Wave Box

The actual movement of polygon data occurs by attempting movements of polygon data falling within a wave box as it moves over the design. The wave box is passed over the design in various wave directions. A wave direction is the direction that the wave box is flowing over the drawing. The wave direction is defined as top to bottom, left to right, bottom to top, angular, etc. Segments and subsegments falling within the wave box are moved as the wave box sweeps across the design. The wave box hits the design from varying directions until the design is design rule correct, and the movements of polygon data have reached a point of diminishing return in terms of optimization based on the new design rules. That is, until there is very little, if any movement of polygon data, or when polygon movement is no longer tending towards optimization.

As the wave box passes over the design, the attempted moves are checked for capability and direction through use of the TF.

The present apparatus and method defines a wave box as the length of the top side of the design (for a top to bottom wave). When the wave box is moved, both original data and equated data are considered. That is segments and subsegments of original data, and segments and subsegments of equated data are considered for movement to meet the new design rules. This provides movement of segments and subsegments in the layers of the original data, and movement of segments and subsegments in the created equated layers. There may be moving in each of the original data layers and created equated layers, but the movements will be constrained by the relationships between the layers.

The width of the wave box is a small amount such as 0.002 units. The box is placed at the top of the design (for a top to bottom wave) and moves downward a small amount at a time (e.g., 0.002 units each move). When a horizontal sub coordinate pair segment appears in the wave box, it moves that sub coordinate pair segment downward or upward according to the movement formula assigned to that sub coordinate pair segment, if the formula assigned to that SCPS (sub coordinate pair segment) finds that no movement is necessary, the program leaves that SCPS in place. If there is no DRC violation the SCPS may or may not move, but if the SCPS movement will create a DRC error the SCPS will not move. After all the DRC violations that exist are fixed then the flow may try to crunch the design down making the layout as optimum as possible.

A general movement formula appears as follows:

> coordinate x1, coordinate y1, coordinate x2, coordinate y2, limiter 1, limiter 2, . . . , limiter N.

A more specific movement formula might be:

> coordinate x1, coordinate y1, coordinate x2, coordinate y2, layer, layer it effects, area moving, area effected, direction, segment move factor, equal layers that will move with it, etc.

Each coordinate pair must have limiters defined by the TF which are created for the process. This allows the polygon movement formulas to be adjusted to any IC process, which allows the polygon movement formula to be automatically updated and automatically move polygon data.

An example of a polygon move. Taking metal one in a standard inverter

| | |
|---|---|
| Vdd metal on top | labeled Vdd |
| Vss metal on bot | labeled Vss |
| node metal | labeled output |

This inverter has been verified (LVS) to be correct (it is an inverter). There are no w/l errors after the percentage of shrink. The original data is shrank by the design qualifier of 20%. For the sake of argument, assume that Vss and Vdd rules are the same—spacing of 1 unit switching to 0.8 units, and that the width is different without need of adjustment, width of 2.4 switching to a design rule of 2 units (still 20% shrink).

Since the layout design has gone through the LVS program (a logic schematic verses layout verification tool) the program will know where all the power shapes (vss and vdd) are located and that those shapes need to be different than regular metal or node metal. The diffusion needs to be kept as resistance and capacitance free as possible, along with electrical characteristics of other layers. Since the method and apparatus knows where those critical shapes are on various layers it can switch those shapes to equated layers (meaning the critical areas are given different values) for use in movement of a different fashion with different rules for those electrical characteristics.

The program moves the SCFS by use of a limiter, which is defined in the technology file by the user. The limiter is usually a fraction of the layer design rules or is a limitation of movement to the distance of grid size used in the process. For example, assume the grid size is 0.05 units each move. When the wave box has an SCPS that needs to be moved, the program adjusts the segment according to the limiter and grid size. That is, the program moves the segment downward, in this case or 0.05 units. After this is done, however, the original coordinate segment has an opening in it that must be fixed.

To fix this movement the apparatus and method of the present invention assigns two more segments attached to the moved segment.

1. On the left side of the moved SCPS there must be a segment that reaches vertically, from where the left side of the moved SCPS originated, to the left side of the moved SCPS. (the right side of SCPS #2 to the left side of SCPS #3) This first segment can be deleted if the SCPS #2 moves the same distance as SCPS #3.

2. On the right side of the moved SCPS there must be a segment that reaches vertically, from where the right side of the moved SCPS #3 originated, to the right side of the moved SCPS #3. (the right side of SCPS #3 to the bottom of the vert segment on the right) The vert segments are then recalculated and new vertical sub coordinate pair segments are assigned to those vertical segment. Those new vertical sub coordinate pair segments are then ready for a left to right wave or right to left wave etc.

After the initial wave the apparatus and method go through a number of different waves, left to right, diagonal etc. until the optimum design without violation is met. Another possible wave is from the center out, or from the outside towards the center. Then hierarchy is reintroduced into the data.

System Architecture

Figure 10:
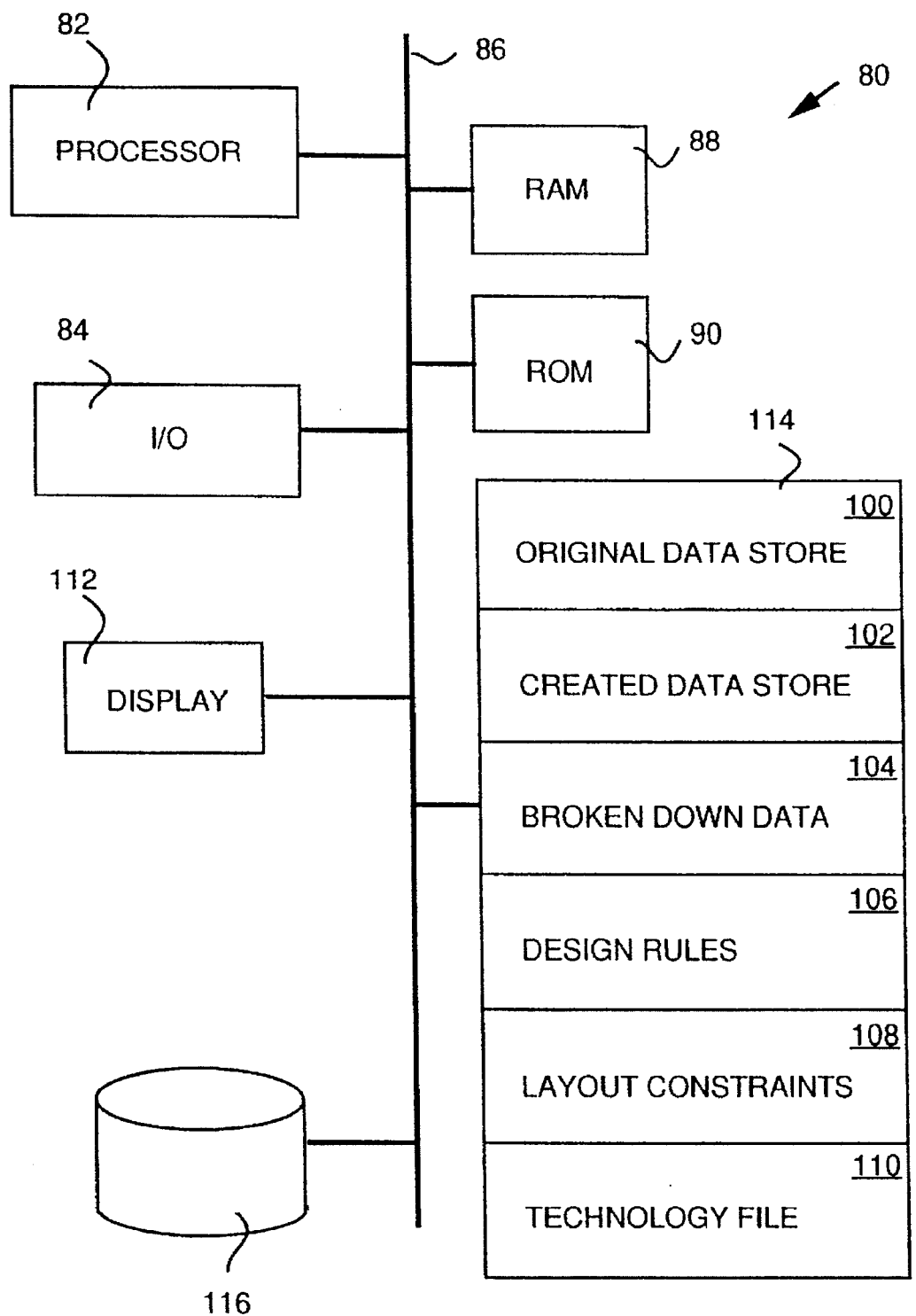
FIG. 10 is a system hardware architecture for carrying out the present invention and apparatus.

FIG. 10 shows an architecture 80 to implement the apparatus and method defined by the present invention. The common bus 86 connects Processor 82, I/O 84, Display 112, RAM 88, ROM 90, Memory 114, and Mass Store 116. Processor 82 may be any type of computer, such as a UNIX machine, necessary to carry out the number crunching of the present invention. For example, a Cray supercomputer may be used for extremely high density layout redesign, whereas a Sun workstation may be adequate for lighter redesign applications. I/O 84 includes human and system I/O, such as mice and other gesture input devices, and modems, network connections, etc. ROM 90 may advantageously store an operating system, which may, alternatively, be partially or wholly contained in Processor 82. Memory 114 represents the data which is developed during the course of implementing the present apparatus and method. The data could also be stored in RAM 88 or Mass Store 116. Display 112 offers the user involved with implementing the system and method the opportunity to review data being input into the system to be processed by the apparatus and method, as well as any data which might be developed as a result of the processing carried out by the apparatus and method described herein. Mass Store 116 could be any memory system, including tape, optical disk, or RAID system, for example.

The apparatus of the present invention is defined by the system architecture as it performs the necessary functions to carry out the redesign as discussed above. The method of the present invention is defined by the system architecture as it performs the steps necessary to carry out the redesign process as discussed above. The architecture is capable of implementing a wide variety of programs which may be useful while carrying out the program. For example, the architecture is capable of performing DRC programs, Verification programs, hierarchical design extraction programs, and layout editing tools. Typical sources of these types of programs are companies, such as Cadence, Integrated Silicon Systems and Mentor Graphics.

The architecture is not meant to be limiting in any way to the overall apparatus and method described above.

Conclusion

While the invention has been described in terms of a preferred embodiment in a specific system environment, those skilled in the art recognize that the invention can be practiced, with modification, in other and different hardware and software environments within the spirit and scope of the appended claims.

Having thus described our invention, what we claim as new, and desire to secure by Letters Patent is:

1. A method for redesigning an original physical layout from a representation of the original layout, comprising:

receiving original data comprised of two or more layers defining the representation of the original layout;

analyzing the two or more layers to discover relationships between the two or more layers;

applying new design rules to develop created data; and, moving the original data and the created data in accordance with the new design rules to redesign the original layout such that the redesigned layout is optimized and physically distinct from the original layout.

2. The method according to claim 1, wherein the original data is manipulated data.

3. The method according to claim 1, wherein the created data is layer data which defines at least one polygon relationship between layers of said two or more layers.

4. The method according to claim 1, wherein the created data is layer data which defines at least one relationship on one layer of said two or more layers.

5. The method according to claim 1, wherein the created data is layer data which defines at least one relationship between one layer of said two or more layers and multiple other of the two or more layers.

6. The method according to claim 1, wherein the step of moving includes applying basic principles of physical layout design.

7. The method according to claim 1, further including the step of determining whether one or more segments of original data may be broken down further.

8. The method according to claim 1, further including the step of determining whether one or more segments of created data may be broken down further.

9. The method according to claim 1, wherein the step of moving includes using a technology file to control the moving.

10. The method according to claim 1, wherein the step of moving includes using a wave box to control the moving.

11. Apparatus for redesigning an original layout from a representation of the original layout, comprising:

a receiver for receiving original data comprised of two or more layers defining the representation of the original layout;

an analyzer for analyzing the two or more layers to discover relationships between the two or more layers;

a developer for applying new design rules to develop created data; and, a redesigner for moving the original data and the created data in accordance with the new design rules to redesign the original layout such that the redesigned layout is optimized and physically distinct from the original layout.

12. The apparatus according to claim 11, wherein the original data is manipulated data.

13. The apparatus according to claim 11, wherein the created data is layer data which defines at least one polygon relationship between layers of said two or more layers.

14. The apparatus according to claim 11, wherein the created data is layer data which defines at least one relationship on one layer of said two or more layers.

15. The apparatus according to claim 11, wherein the created data is layer data which defines at least one relationship between one layer of said two or more layers and multiple other of the two or more layers.

16. The apparatus according to claim 11, wherein the developer comprises:

a design rule applier for applying the new design rules.

17. The apparatus according to claim 11, wherein the developer comprises:

a principle applier for applying basic principles of layout design.

18. The apparatus according to claim 11, wherein the redesigner comprises:

a determining element which determines whether one or more segments of original data may be broken down further.

19. The apparatus according to claim 11, wherein the redesigner comprises a determining element which determines whether one or more segments of created data may be broken down further.

20. The apparatus according to claim 11, wherein the redesigner comprises:

a mover for moving entities representing the layout.

21. The apparatus according to claim 20, wherein the mover comprises:

a technology file to control the moving.

22. The apparatus according to claim 20, wherein the mover comprises:

a wave box to control the moving.

* * * * *

(12) EX PARTE REEXAMINATION CERTIFICATE (6340th)
United States Patent
Woolbright

(10) Number: US 5,640,497 C1
(45) Certificate Issued: Aug. 5, 2008

(54) LAYOUT REDESIGN USING POLYGON MANIPULATION

(75) Inventor: Phillip Alexander Woolbright, Lake Havasu City, AZ (US)

(73) Assignee: APM Design Laboratories, Inc., Peoria, AZ (US)

Reexamination Request:
No. 90/007,432, Feb. 24, 2005

Reexamination Certificate for:
Patent No.: 5,640,497
Issued: Jun. 17, 1997
Appl. No.: 08/377,008
Filed: Jan. 23, 1995

(51) Int. Cl.
*G06T 11/60* (2006.01)
*G06F 17/50* (2006.01)

(52) U.S. Cl. .................... 716/11; 345/630; 706/921; 715/964

(58) Field of Classification Search ............ None
See application file for complete search history.

(56) References Cited

PUBLICATIONS

Waterkamp, "Technology Tracking of Non Manhattan VLSI Layout", Paper 20.2, 26th ACM/IEEE Design Automation Conference, 1989, pp. 296–301.
Chu, "Technology Tracking for VLSI Layout Design Tools", Pagper 19.2, 22nd Design Automation Conference, 1985, pp. 279–285, IEEE.
Marple, "A Hierarchy Preserving Hierarchal Compactor", Paper 22.2, 27th ACM/IEEE Design Automation Conference, 1990, pp. 375–381.
Lo, "Automatic Tub Region Generation for Symbolic Layout Compaction", Paper 20.3, 26th ACM/IEEE Design Automation Conference, 1989, pp. 302–306.
Malik, "An Efficient Algorithm for Generation of Constraint Graph for Compaction", IEEE International Conference on Computer–Aided Design, 1987, pp. 130–133.
Greene, Jonathan W., Layout–to–Layout Compaction for Technology Coversion, VLSI Systems Design, Nov. 1986.
Schiele, Werner, Design Rule Adaptation of Non–Orthogonal Layouts with Approximated Scaling, The VLSI Journal, 1985, pp. 273–282.
Schiele, Werner, Automatic Design Rule Adaptation of Leaf Cell Layouts, Integration, the VLSI Journal 3, 1985, pp. 93–112.
Scott, Walter S. and Ousterhout, John K., Plowing: Interactive Stretching and Compaction in Magic, 21st Design Automation Conf., 11.3.

*Primary Examiner*—Albert J Gagliardi

(57) ABSTRACT

A method and system for redesigning layouts adjusts polygon data to develop a new layout which meets new design rules. Polygon data defining the original layout is further broken down into equated layers which are logical combinations of the layers in the original layout. The further broken down data is typically in the form of rectangles, and associated information regarding how that particular rectangle was formed by logical combination of layers. This further broken down information is then moved to conform to the new design rules, and the moves are checked against a technology file to ensure that the particular movement can be made.

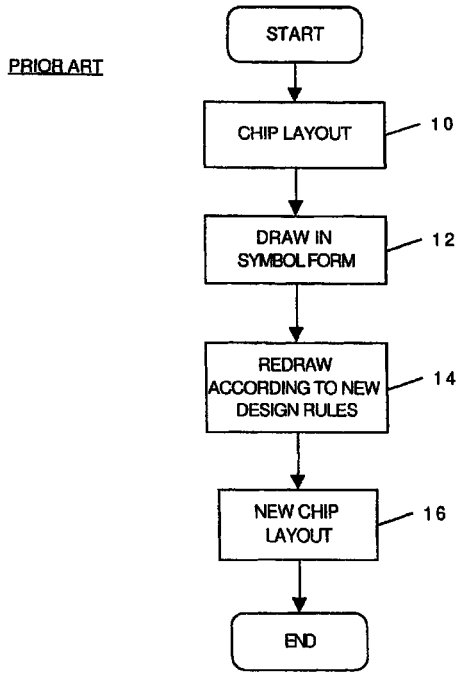

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–22 are cancelled.

* * * * *